US009270269B2

(12) United States Patent
Shepard

(10) Patent No.: US 9,270,269 B2

(45) **Date of Patent: *Feb. 23, 2016**

(54) BIPOLAR-MOS MEMORY CIRCUIT

(71) Applicant: HGST, Inc., San Jose, CA (US)

(72) Inventor: Daniel R. Shepard, North Hampton, NH (US)

(73) Assignee: HGST, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/628,925

(22) Filed: Feb. 23, 2015

(65) Prior Publication Data

US 2015/0171864 A1 Jun. 18, 2015

Related U.S. Application Data

(63) Continuation of application No. 13/714,499, filed on Dec. 14, 2012, now Pat. No. 9,007,801, which is a continuation-in-part of application No. 13/267,985, filed on Oct. 7, 2011, now Pat. No. 8,415,024, which is a continuation of application No. 12/827,545, filed on Jun. 30, 2010, now Pat. No. 8,035,416.

(60) Provisional application No. 61/270,432, filed on Jul. 7, 2009, provisional application No. 61/630,682, filed on Dec. 16, 2011.

(51) Int. Cl.

| | |
|---|---|
| ***G11C 5/06*** | (2006.01) |
| ***H03K 19/00*** | (2006.01) |
| ***H01L 29/66*** | (2006.01) |
| ***G11C 11/412*** | (2006.01) |
| ***G11C 11/22*** | (2006.01) |
| ***G11C 11/4097*** | (2006.01) |
| ***H03K 19/094*** | (2006.01) |
| ***H03K 19/082*** | (2006.01) |
| ***H03K 19/0948*** | (2006.01) |
| *G11C 11/06* | (2006.01) |

(52) U.S. Cl.

CPC .............. *H03K 19/0013* (2013.01); *G11C 5/06* (2013.01); *G11C 11/22* (2013.01); *G11C 11/4097* (2013.01); *G11C 11/412* (2013.01); *H01L 29/66234* (2013.01); *H03K 19/001* (2013.01); *H03K 19/082* (2013.01); *H03K 19/094* (2013.01); *H03K 19/0948* (2013.01); *G11C 11/06007* (2013.01)

(58) Field of Classification Search

CPC .. G11C 11/4097; G11C 11/412; G11C 11/22; G11C 11/06007

USPC ........................................... 365/72, 145, 243

See application file for complete search history.

(56) References Cited

U.S. PATENT DOCUMENTS

| | | | |
|---|---|---|---|
| 4,236,121 | A | 11/1980 | Senturia |
| 4,813,020 | A | 3/1989 | Iwamura et al. |
| 5,166,551 | A | 11/1992 | Kamuro |
| 5,198,704 | A | 3/1993 | Nitta et al. |
| 5,365,123 | A | 11/1994 | Nakase et al. |

(Continued)

*Primary Examiner* — Pho M Luu

(74) *Attorney, Agent, or Firm* — Patterson & Sheridan, LLP

(57) ABSTRACT

Electronic memory circuits, and more particularly, low power electronic memory circuits having low manufacturing costs are disclosed. The present invention is a circuit design that utilizes two transistor types—bipolar and MOS (but, not both NMOS and PMOS) one of which can be manufactured together with the memory cell's non-linear conductive elements (such as a diode) thereby reducing the number of processing steps and masks and resulting in lower cost.

7 Claims, 11 Drawing Sheets

155 156 158 152 151 WORD LINES 150 154 PRCH A1 A̅1̅ A0 A̅0̅ EN 153 RST 158 157

(56) References Cited

U.S. PATENT DOCUMENTS

| | | | | |
|---|---|---|---|---|
| 5,404,056 | A | 4/1995 | Maeda | |
| 5,696,715 | A | 12/1997 | Maejima et al. | |
| 5,881,221 | A | 3/1999 | Hoang et al. | |
| 6,091,278 | A | 7/2000 | Tan | |
| 7,173,843 | B2 | 2/2007 | Kang | |
| 7,499,315 | B2 | 3/2009 | Lowrey et al. | |
| 7,813,157 | B2 * | 10/2010 | Shepard | 365/105 |
| 8,035,416 | B1 * | 10/2011 | Shepard | 326/84 |
| 8,130,537 | B2 | 3/2012 | Weis | |
| 8,451,024 | B2 * | 5/2013 | Shepard | 326/84 |
| 8,750,018 | B2 * | 6/2014 | Youn et al. | 365/148 |
| 9,007,801 | B2 * | 4/2015 | Shepard | 365/72 |
| 2005/0174839 | A1 | 8/2005 | Kang | |
| 2005/0254283 | A1 | 11/2005 | Kang | |
| 2006/0171194 | A1 | 8/2006 | Lowrey et al. | |
| 2008/0288785 | A1 | 11/2008 | Rao et al. | |
| 2010/0061145 | A1 | 3/2010 | Weis | |

* cited by examiner

BIPOLAR-MOS MEMORY CIRCUIT

CROSS REFERENCE TO RELATED APPLICATIONS

This application is a continuation of U.S. patent application Ser. No. 13/714,499, filed on Dec. 14, 2012, and now issued as U.S. Pat. No. 9,007,801, which (i) is a continuation in part of U.S. patent application Ser. No. 13/267,985, filed on Oct. 7, 2011, which is a continuation of U.S. patent application Ser. No. 12/827,545, filed on Jun. 30, 2010, which claims priority to and the benefit of U.S. Provisional Patent Application Ser. No. 61/270,432, filed on Jul. 7, 2009, and (ii) claims priority to and the benefit of U.S. Provisional Patent Application Ser. No. 61/630,682, filed on Dec. 16, 2011, the entire disclosure of each of which is incorporated by reference herein.

CROSS-REFERENCE TO RELATED PATENTS

This application makes reference to U.S. Pat. No. 7,813,157 by Shepard that issued on Oct. 12, 2010 and is titled "Non-Linear Conductor Memory" and that patent is hereby incorporated herein by reference in its entirety.

FIELD OF THE INVENTION

The present invention relates to electronic memory circuits, and more particularly, to electronic memory circuits having high operating speed and low manufacturing costs.

REFERENCE REGARDING FEDERAL SPONSORSHIP

Not Applicable

STATEMENT REGARDING FEDERALLY SPONSORED RESEARCH OR DEVELOPMENT

Not Applicable.

SUMMARY OF THE INVENTION

Logic circuits have been constructed from many different transistor types. The preferred type at present for portable devices is CMOS. Bipolar circuits, such as TTL or RTL, are very fast but consume much power. This is because current is flowing continuously. TTL will typically utilize PNP and NPN type bipolar transistors. CMOS utilizes two transistor types: NMOS and PMOS. The advantage to CMOS is that only one of two transistors is switched on at a time resulting in a circuit in which current flows only when the logic state is switching. Certain capacitances in the circuit (e.g., the gate of the MOS devices) can result in slower operation, but power consumption is low. A disadvantage to these approaches is that of the multiple transistor types, each can require a large number of processing steps and photolithography masks to manufacture. Multiple types means multiple large sets of processing steps and expensive masks.

The present invention is a circuit design that utilizes two transistor types—bipolar and MOS (but, not both NMOS and PMOS) and when manufacturing the circuits on a single integrated circuit chip, the bipolar transistors can be manufactured in parallel with the memory cell's non-linear conductive current steering elements (such as diodes) thereby reducing the number of processing steps and masks and resulting in lower cost.

DESCRIPTION OF THE PREFERRED EMBODIMENT

Figure 1:
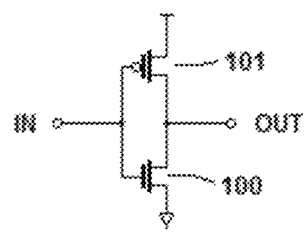
FIG. 1 illustrates a prior art driver circuit using CMOS logic.

Logic circuits have been constructed from many different transistor types. FIG. 1 depicts a prior art CMOS logic device (an inverter). The device is simple in design having just an NMOS 100 and a PMOS 101 transistor. When the input is high, the NMOS transistor 100 is switched on and the PMOS transistor 101 is switched off; with the NMOS transistor 100 switched on, the output is connected through the NMOS transistor 100 to ground. When the input is low, the PMOS transistor 101 is switched on and the NMOS transistor 100 is switched off; with the PMOS transistor 101 switched on, the output is connected through the PMOS transistor 101 to the positive supply. Since the NMOS 100 and PMOS transistor 101 are not on simultaneously (except for a moment during transition of the input from high to low or low to high), current does not flow in the circuit except during switching. Even at the output, given the typical case where the output is connected to the input of another similar device, current only flows through the switched on NMOS 100 or PMOS transistor 101 during transition so as to charge or discharge the MOS transistor gates of the subsequent stages.

Figure 2:
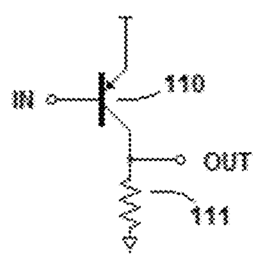
FIG. 2 illustrates a prior art, RTL driver circuit using bipolar logic.

With a bipolar circuit, as is depicted in FIG. 2, current typically flows from stage to stage as a function of the logic state. In FIG. 2, a RTL inverter will consume no power when the input is high as this will reverse bias the base junction of PNP transistor 110 resulting in that transistor being switched off. However, when the input is low, current flows from the positive supply through the emitter and base connections and to the low input source; current also flows from the positive supply through the transistor 110 and through resistor 111 to ground resulting in a high voltage at the output. In a typical case where the output is connected to the input of a similar circuit, when current is flowing through the first circuit resulting in a high output, the transistor of a subsequent circuit will be switched off. However, when the input is high to the first circuit and the current if not flowing, the output will be low and a subsequent circuit will have current flowing from the positive supply through the emitter-base junction and back into the resistor of the prior circuit. Current typically is flowing somewhere all the time. The same is generally true for RTL constructed from NPN transistors and for TTL logic. One advantage to RTL is that is can be made from a single transistor type (NPN or PNP).

Figure 3:
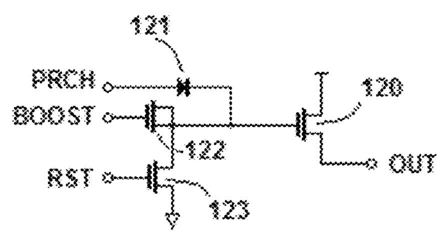
FIG. 3 illustrates a prior art driver circuit using NMOS logic.

What is needed is a logic design in which only one transistor type is used and current generally does not continuously flow. One such design is shown in FIG. 3. In this MOS design, only NMOS transistors are used. The output is controlled by NMOS transistor 120. A problem presented here is that in order to pass the voltage level of the supply to the output, the voltage on the gate of NMOS transistor 120 must exceed the voltage to be provided to the output by the threshold voltage ($V_{th}$) of the NMOS transistor 120. To achieve this, assuming that the highest available voltage is the supply voltage, the gate voltage must be generated by the circuit. In this case, the voltage on the gate of NMOS transistor 120 is generated in stages. First, the largest available voltage (the supply voltage) is applied to the precharge (PRCH) input through diode 121 while the boost (BOOST) and reset (RST) inputs are held low. Then, the boost input is raised and the rising edge is capacitively coupled through NMOS transistor 122 which is wire up as a capacitor. The capacitively coupled boost voltage will raise the voltage on the gate resulting from the precharge input up to a new higher voltage that will enable the output NMOS transistor 120 to pass the desired voltage to the output. To switch off the output, the precharge input must first be lowered and then the reset input (RST) raised; this will dump the charge from the gate of NMOS transistor 120 through reset NMOS transistor 123 to ground, thereby switching off the output NMOS transistor 120. The disadvantage is that the series of steps to switch on and off the various inputs results in slower operation. (Similar circuits can be constructed using opposite voltage polarities and PMOS transistors.)

Figure 4:
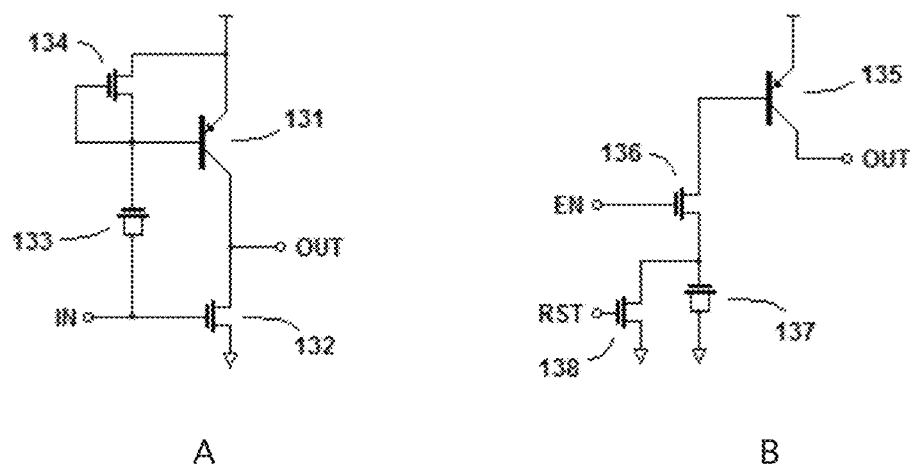
FIG. 4 illustrates (A) an inverter circuit and (B) a driver circuit according to the present invention.

The present invention is a combination of bipolar logic and a single type of MOS logic (either NMOS or PMOS but not both). FIG. 4 depicts two bipolar-MOS type circuits—at (A) an inverter and at (B) a driver.

In the inverter circuit, output PNP transistor 131 will provide a voltage pulse to the output, OUT, that can be within the emitter-collector saturation voltage ($V_{CESAT}$) of the positive supply when input, IN, transitions from high to low and will pull the output, OUT, to ground through NMOS transistor 132 when the input, IN, is high. With the input transitioning from high to low, the base input to PNP transistor 131 in capacitively pulled low through NMOS transistor 133 which is wired up as a capacitor. Current will flow into the emitter of PNP transistor 131 from the positive supply until capacitor 133 is fully charged; while capacitor 133 is charging, current will also flow from the positive supply through the PNP transistor 131 and out its collector terminal to the output, OUT, with transistor gain (i.e., collector current generally equals the base current multiplied by the β of the transistor 131). Assuming a capacitive load, the sizing of capacitor 133 should be done to fully charge the capacitive load whereby the capacitor 133 will be approximately equal to the load capacitor divided by the β of the transistor 131, ignoring other factors. Looking at FIG. 4A, as will be clear to those skilled in the art, when the input, IN, goes high, the base of the transistor goes high and the currents in the PNP transistor 131 are turned off. The capacitive coupling of the base terminal of PNP transistor 131 will allow the voltage to rise above the positive supply voltage, so diode 134 (actually, as shown, an NMOS wired up as a diode) will dump any charge on capacitor 133 to the positive supply (until the voltage on the base terminal falls to the positive supply voltage plus either the forward voltage, $V_f$, of the diode or, if using a diode-wired NMOS transistor, the threshold voltage, $T_{TH}$, of the NMOS transistor).

In the driver circuit drawn in FIG. 4B, when the enable input, EN, goes high, the output will go high. This is accomplished with the reset input, RST, low by connecting the base of PNP transistor 134 through enable NMOS transistor 136 to NMOS transistor 137 which is wired up as a capacitor; the current will flow from the positive supply through the emitter-base junction of PNP transistor 135 and into capacitor 137 until that capacitor is fully charged. The size of capacitor 137 determines the duration of this current pulse. While this current pulse is flowing, current will flow to the output in an amplified amount as a function of the gain (i.e., the transistor Beta, β) of PNP transistor 135. When capacitor 137 is charged, the current through PNP transistor 135 stops flowing. The enable NMOS transistor 136 is turned on by raising the voltage on the enable input, EN. The circuit is reset by lowering the voltage on the enable input, EN, and then raising the voltage on reset input, RST, which will cause the charge on reset NMOS transistor 138 to be dumped to ground. Because PNP transistor 135 is switched on by lowering the voltage on its base, no boost voltage level is required and the two steps of pre-charging and then boosting as is required for the circuit depicted in FIG. 3 is replaced by the single step of raising the enable input in the circuit depicted in FIG. 4. This results in greater speed in operation. Furthermore, since the current only flows when the enable input, EN, is first raised (i.e., until capacitor, 137, is charged), the power consumed is similar to that of a CMOS circuit (i.e., current only flows during switching while the gate of a MOS transistor is being charged). Also, the output voltage pulse can come to within $V_{CESAT}$ of the supply voltage without boost circuitry. (Similar circuits can be constructed using opposite voltage polarities and PMOS and NPN transistors.)

The driver circuit of FIG. 4B is the basic memory array word line driver circuit. It can be likewise constructed without the capacitor, 137, and its associated reset switch, 138; The enable NMOS transistor could simply connect directly to ground whereby the timing control would be accomplished by controlling the level on the enable input, EN. The general concept is the same, however. In a CMOS design, one transistor type is utilized to pull an internal node to ground (the NMOS) and another transistor type is utilized to pull an internal node to the positive supply (the PMOS). However the present invention avoids the processing required to fabricate both NMOS and PMOS on the same substrate thereby saving the cost of that fabrication. In particular, in a diode array memory where diodes will also have to be formed, a design which used a single type of MOS transistor (i.e., either NMOS or PMOS) and a bipolar transistor in the place of the MOS transistor type not used and where this bipolar transistor type if fabricated generally in parallel with the diode fabrication. The resulting elimination of process steps makes a significant reduction to the final device cost (as disclosed below). When using NMOS, a PNP bipolar transistor is typically desired because the PNP can be switched on by pulling its base toward ground (which is what an NMOS does so well). When using PMOS, a NPN bipolar transistor is typically desired because the NPN can be switched on by pulling its base toward the positive supply (which is what a PMOS does so well). This pairing simplifies circuit design while keeping costs low.

Figure 5:
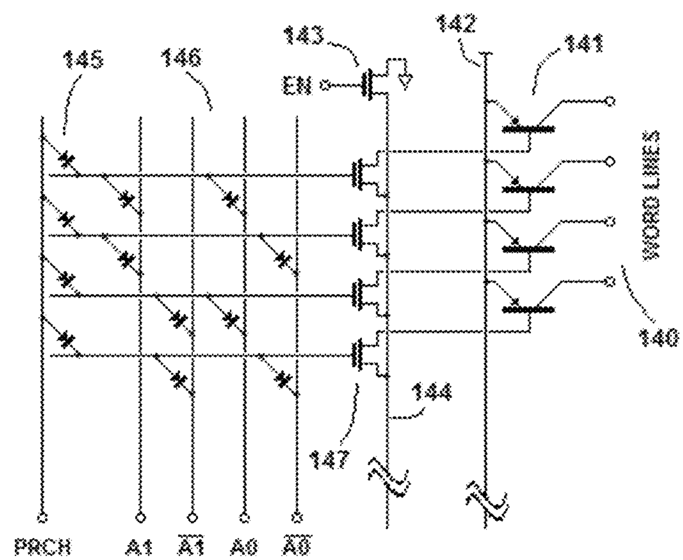
FIG. 5 illustrates a memory array address decoder and driver circuit according to the present invention having static current.

FIG. 5 depicts an address decoder and driver circuit for use with a memory array such as cross point memory array. In this circuit, each of a set of word-lines, 140, has a corresponding PNP (bipolar) transistor, 141, as a word-line driver. The emitters of these PNP transistors, 141, are all wired to a positive supply bus, 142, such that if the base terminal of any one PNP transistor, 141, is pulled low, base current will be drawn out of that base and collector current will flow to the corresponding word-line generally equal to the base current multiplied by the β of that PNP transistor, 141, thereby energizing that corresponding word-line. In the present circuit instance as shown in FIG. 5, each PNP transistor base is individually connected through a small NMOS transistor, 147, to a common ground bus, 144, whereby this ground bus, 144, can be connected to and disconnected from circuit ground by an enable NMOS transistor, 143, by raising or lowering, respectively, the enable voltage, EN, on the gate of that enable NMOS transistor, 143. Now, a given word-line can be energized by switching on the NMOS transistor, 147, corresponding to that word-line while also connecting the common ground bus, 144, to ground through enable NMOS transistor, 143, by raising the voltage on the enable input, EN, to a level above the threshold voltage of the enable NMOS transistor, 143.

To switch on one of the NMOS transistors, 147, an address decoder, 146, is utilized. This operation is the same as that described in U.S. Pat. No. 7,813,157 (the '157 patent) by Shepard that issued on Oct. 12, 2010 and is titled "Non-Linear Conductor Memory" and is described in detail in the Description of the Preferred Embodiment disclosed therein. In the present instance, with the enable NMOS transistor, 143, switched off, all of the NMOS transistors, 147, are switched on by applying a high voltage to the precharge input, PRCH, through precharge diodes, 145. This precharge voltage should be high enough to provide a gate voltage that is at or above the switch-on threshold voltage, $V_{TH}$, of the NMOS transistors, 147, while allowing for the forward voltage drop, $V_f$, across the precharge diodes, 145; the precharge voltage input should be between ($V_{TH}$+$V_f$) and the positive supply. Then, the precharge input is lowered and addresses (as low voltage input and floating input complementary address pairs) are applied to the address inputs, A0, A0-bar, A1 and A1-bar causing all but one of the gates of NMOS transistors, 147, to be discharged and switched off as is described in the '157 patent. At this point, energizing the selected word-line is controlled by switching on and off the enable NMOS transistor, 143. The duration of the word-line assertion is as long as the enable input, EN, is held high and so the word-line can be pulsed or controlled statically with this input.

Figure 6:
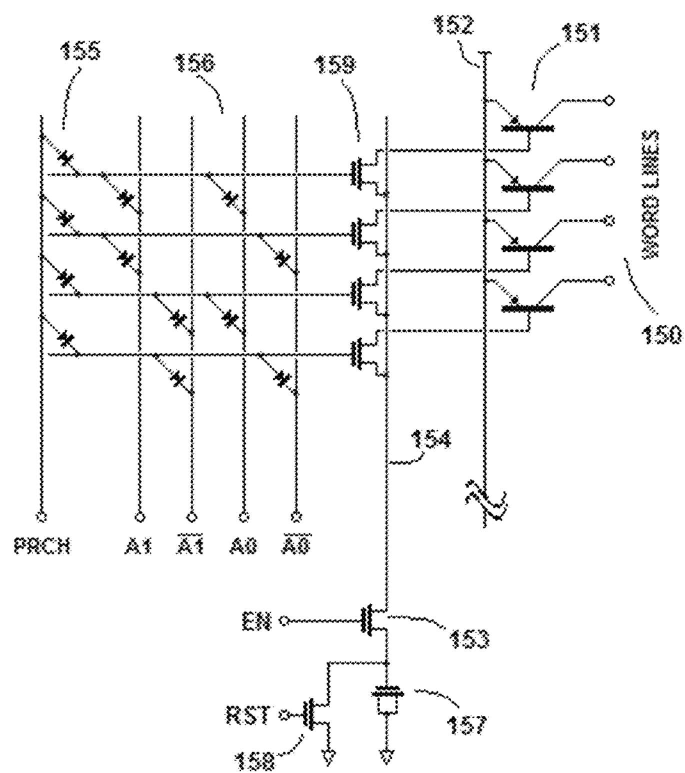
FIG. 6 illustrates a memory array address decoder and driver circuit according to the present invention having dynamic current.

FIG. 6 depicts an identical circuit to that depicted in FIG. 5 except that pulse controlling circuitry as shown in FIG. 4B has been incorporated in place of enable NMOS transistor, 143. In this case, enable NMOS transistor, 153, reset NMOS transistor, 158, and capacitor, 157, perform the same functions as enable NMOS transistor, 136, reset NMOS transistor, 138, and capacitor, 137, as described for the circuit shown in FIG. 4B.

Figure 7:
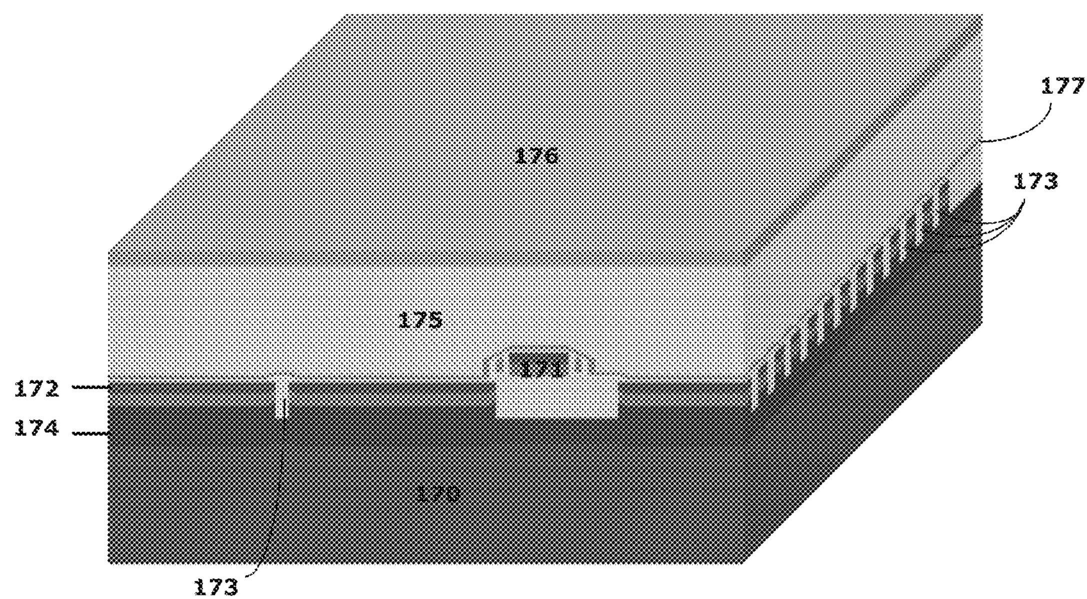
FIG. 7 illustrates a portion of a substrate at a point during manufacture on which NMOS transistors and N-type doped bit-lines have been formed.

The present invention can be manufactured using standard processes. These steps and processing techniques are well understood by those skilled in the art. FIG. 7 depicts a portion of a substrate, 170, at a point during manufacture on which NMOS transistors, 171, and N-type doped bit-lines, 172, have been formed. These bit-lines may be isolated by shallow trench isolation (STI), 173, and a buried P+ implant, 174. On top of this structure is deposited a layer of silicon oxide or some other dielectric, 175, topped by an etch mask layer, 176, such as poly-silicon. The etch mask layer, 176, is provided in case the photoresist is etched away before features can be completely etched through the dielectric layer, 175. A thin layer of etch stop material such as silicon nitride can be deposited just before depositing the dielectric layer, 177, to better set the bottom of the features to be etched through the dielectric layer, 175.

Figure 8:
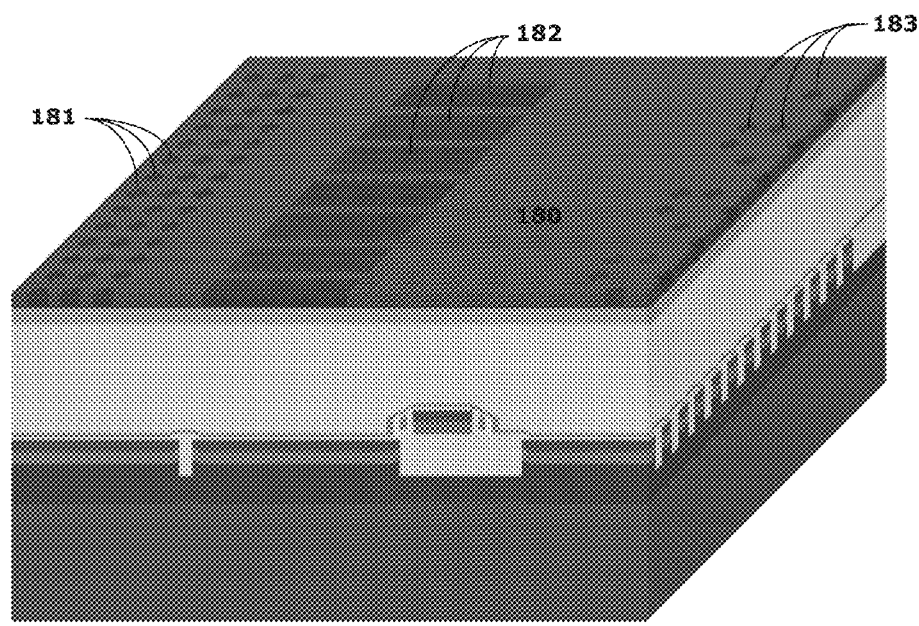
FIG. 8 illustrates a portion of a substrate at a point during manufacture on which photoresist has been exposed to define the area of the bodies of the diodes (for both the memory array storage elements and for the diode decoders) and the area of the bodies of the bipolar transistors.

FIG. 8 depicts the substrate following the application of photoresist, 180, which has been exposed to define the area of the bodies of the diodes (for both the memory array storage elements, 181, and for the diode decoders, 183) and the area of the bodies of the bipolar transistors, 182.

Figure 9:
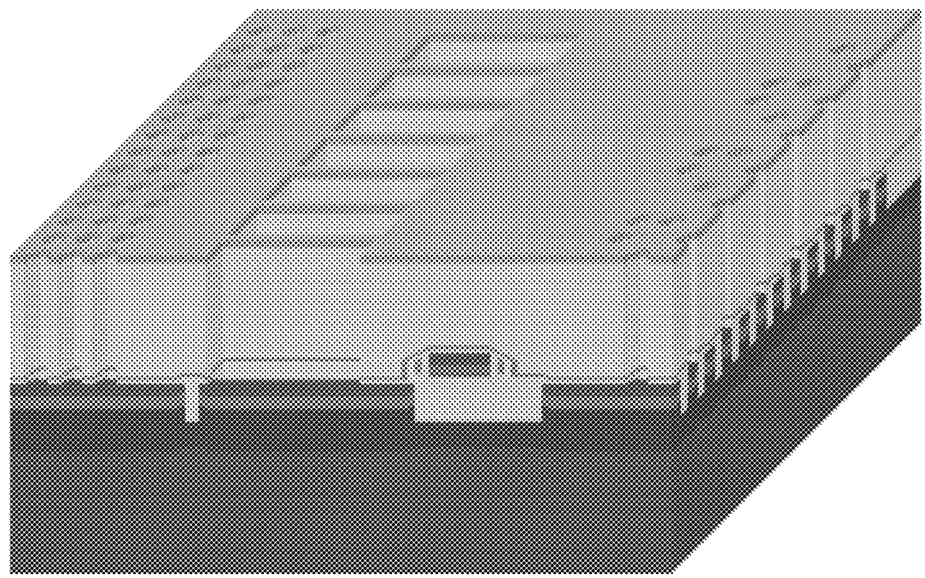
FIG. 9 illustrates a portion of a substrate at a point during manufacture on which the area of the bodies of the diodes (for both the memory array storage elements and for the diode decoders) and the area of the bodies of the bipolar transistors have been etched to provide openings for those devices to be formed.

FIG. 9 depicts the substrate following photo-developing which exposes the area of the bodies of the diodes (for both the memory array storage elements and for the diode decoders) and the area of the bodies of the bipolar transistors and which have been etched to provide openings for those devices to be formed. Note that this etch, as shown, is done in stages. First a silicon etch opens the diode and bipolar transistor features in the hard mask layer. Then a long oxide etch forms the holes for the diodes and the bipolar transistors all the way down to the etch stop layer of silicon nitride. This nitride layer is then opened to extend the holes all the way to the doped silicon bit-line surface. Note that given the very fine geometry of a typical cross-point memory array, the bipolar transistors would be too wide except in the present invention alternate bit-lines in the array exit the array on alternating sides of the array. As a result, the body of the PNP bipolar transistors can be 3× features wide (and much larger in length) whereas the memory array diodes are only 1× wide by 1×; of course, this requires placing half of the PNP bipolar transistors on opposite sides of the array. The PNP bipolar transistors are constructed on a bit-line-like feature that is 3× as wide as a bit-line within the array and only slightly longer that the PNP bipolar transistor body (this extra length is to provide a landing point for a tungsten contact to the bottom of the PNP bipolar transistor structure to enable a contact to the base portion of the PNP bipolar transistor. The photoresist used to begin the etch will typically be entirely etched away during the thick dielectric etch (which is why the hard mask is typically necessary). All of these techniques for etching deep features in a thick dielectric layer such as silicon dioxide are well known and well understood by those skilled in the art.

Figure 10:
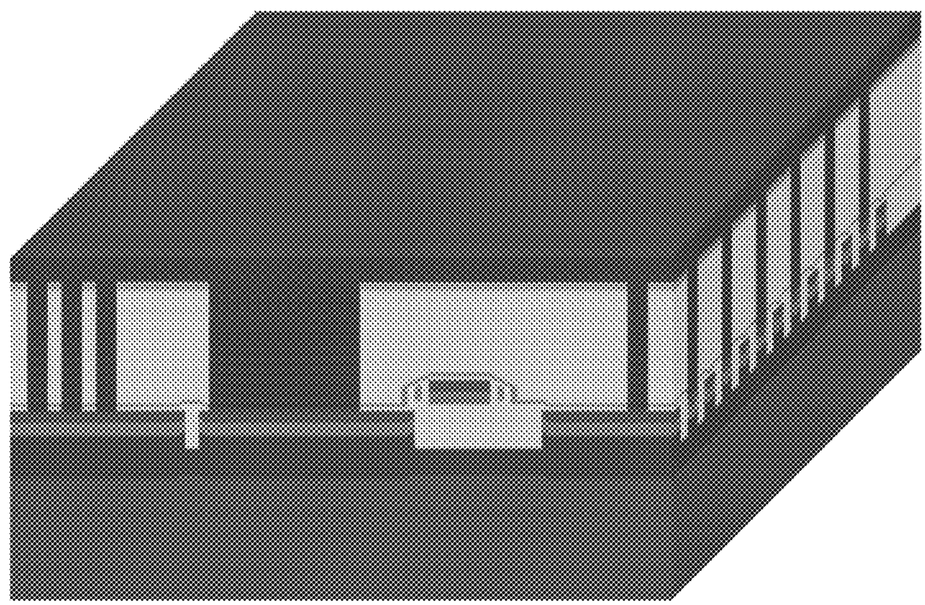
FIG. 10 illustrates a portion of a substrate at a point during manufacture on which the openings etched for the area of the bodies of the diodes (for both the memory array storage elements and for the diode decoders) and the area of the bodies of the bipolar transistors have been filled in with BARC.
Figure 11:
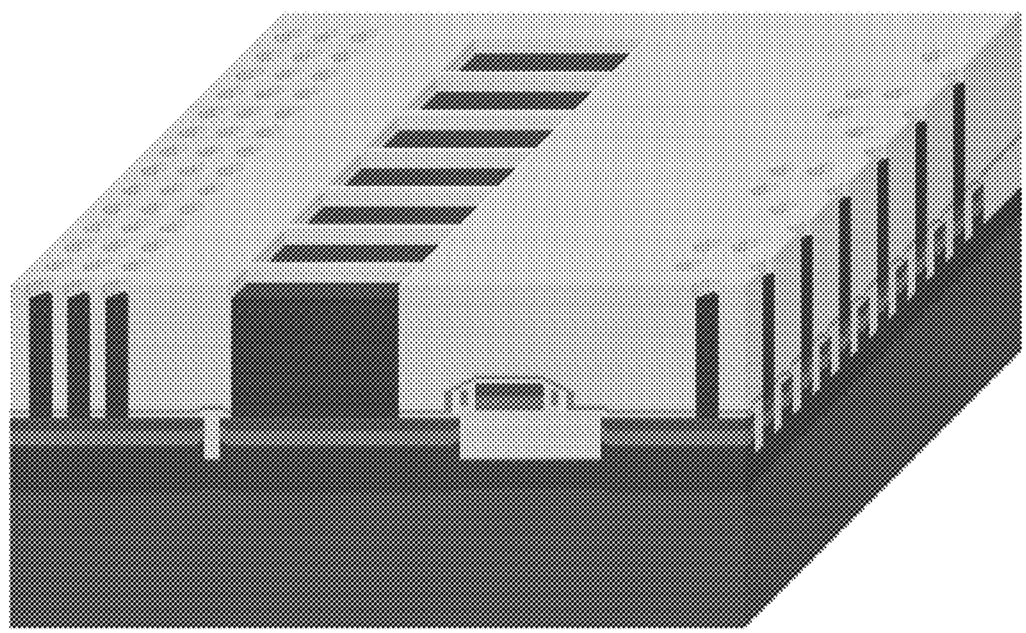
FIG. 11 illustrates a portion of a substrate at a point during manufacture on which the BARC has been etched back such that the surface hard mask has been removed but the bottoms of the etched openings remain protected (from the hard mask etch).
Figure 12:
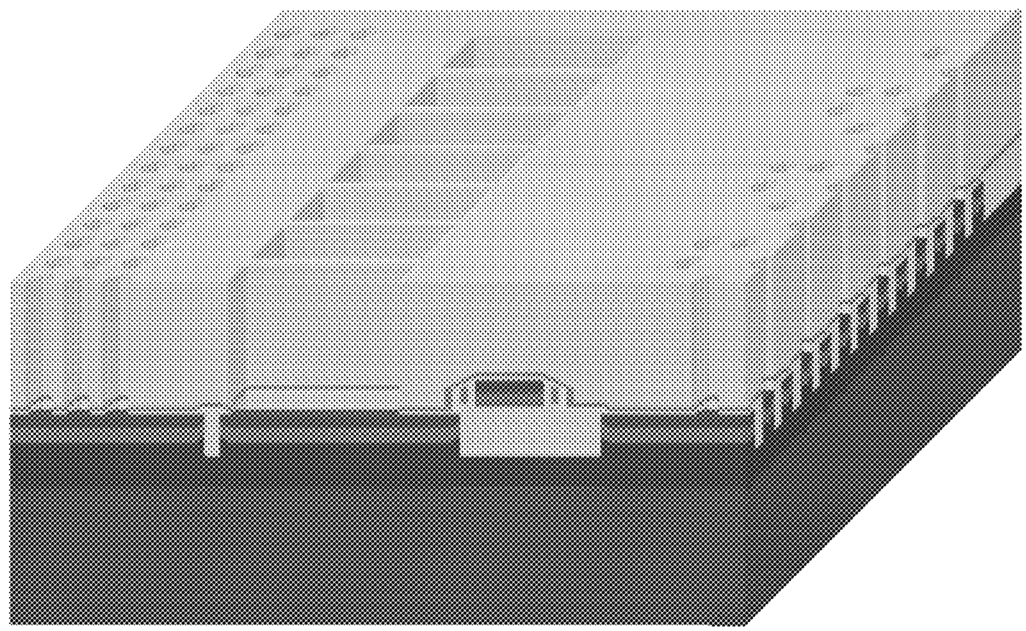
FIG. 12 illustrates a portion of a substrate at a point during manufacture on which the remaining BARC has been stripped away.

FIG. 10 depicts the substrate after the openings have been etched for the area of the bodies of the diodes (for both the memory array storage elements and for the diode decoders) and the area of the bodies of the bipolar transistors and after these openings have been filled in with Anti Reflective Coating (BARC). BARC is used because it can be chemically stripped away but, if etched, it etched at a rate close to that of the poly-silicon hard mask material. By filling the etched openings with BARC, the exposed silicon surfaces at the bottom of the etched openings will be protected while any remaining hard mask material is etched away. Once the hard mask material is etched away (as depicted in FIG. 11), the remaining BARC is stripped away to once again expose the silicon surfaces in the bottoms of the etched openings (as depicted in FIG. 12).

Figure 13:
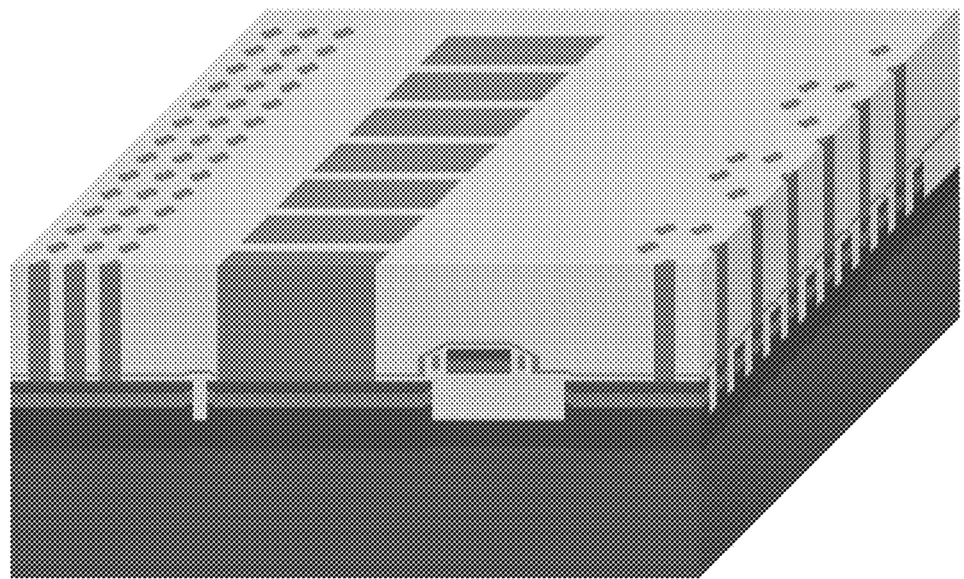
FIG. 13 illustrates a portion of a substrate at a point during manufacture on which the volume of the bodies of the diodes (for both the memory array storage elements and for the diode decoders) and the volume of the bodies of the bipolar transistors have been formed by selective epitaxial silicon growth and then planarized by CMP.

FIG. 13 depicts the substrate following the formation of the volume of the bodies of the diodes (for both the memory array storage elements and for the diode decoders) and the volume of the bodies of the bipolar transistors. These diode bodies and bipolar transistor bodies are formed by selective epitaxial silicon growth. The epi-silicon is grown selectively such that new silicon only grows on an already exposed silicon surface as is well known and well understood by those skilled in the art. Ideally, this growth is performed at a temperature that will not encourage the dopant atoms in the bit-lines to migrate up into the epi-silicon being deposited. For example, a selective epi-silicon growth (SEG) can be performed by a cyclic H2/SiH4/Cl2 cyclic system at 680° C. as was described in a paper titled "Selective Epitaxial Growth of Silicon Layer Using Batch-Type Equipment for Vertical Diode" by Kong-Soo Lee, et. al (Samsung Electronics Co., LTD, Yongin-City, Gyeonggi-Do, 446-711, Korea and School of Information and Communication Engineering, Sungkyunkwan University, Suwon 440-746, Korea, and presented at the ECS-217 Meeting Apr. 25, 2010-Apr. 30, 2010, in Vancouver, Canada). This epi-silicon is grown to overfill the holes and is then planarized by CMP (FIG. 13).

Figure 14:
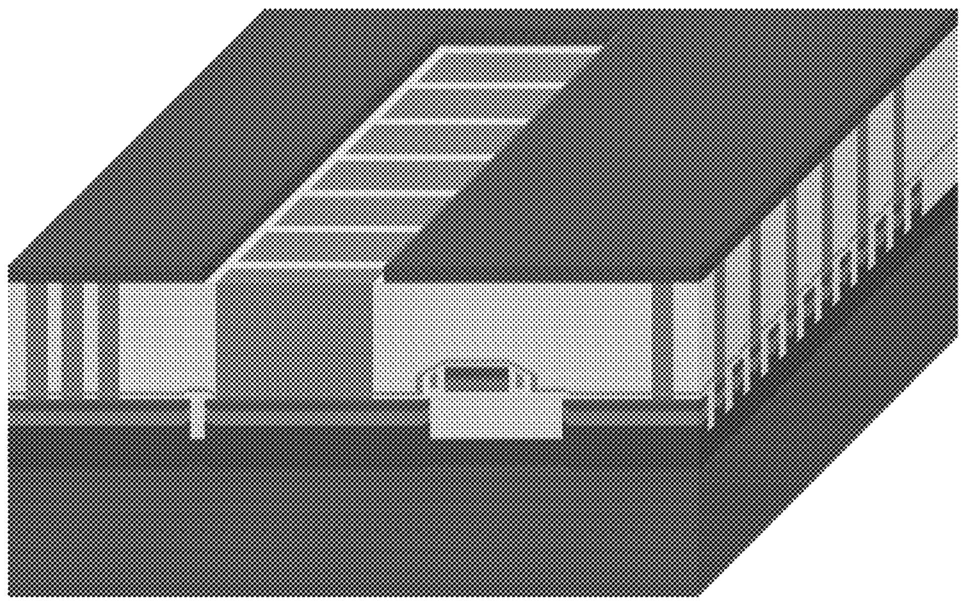
FIG. 14 illustrates a portion of a substrate at a point during manufacture on which photoresist has been exposed to show the area of the bodies of the bipolar transistors but not the area of the bodies of the diodes (for both the memory array storage elements and for the diode decoders) such that the bipolar transistor bodies can be implanted with N-type dopant.
Figure 15:
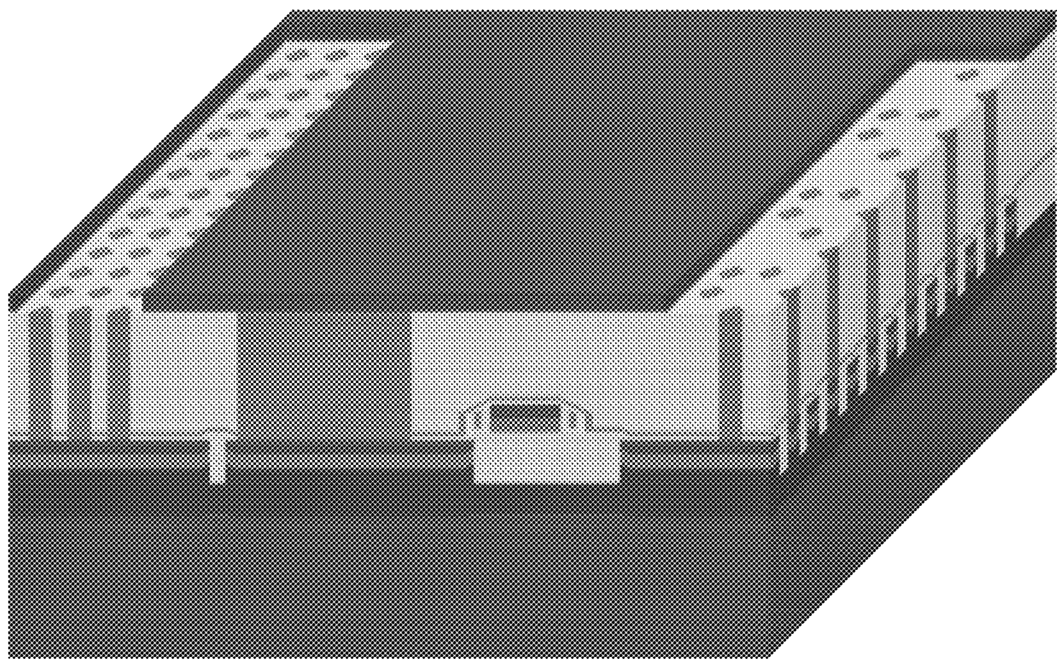
FIG. 15 illustrates a portion of a substrate at a point during manufacture on which photoresist has been exposed to show the area of the bodies of the diodes (for both the memory array storage elements and for the diode decoders) but not the area of the bodies of the bipolar transistors.
Figure 16:
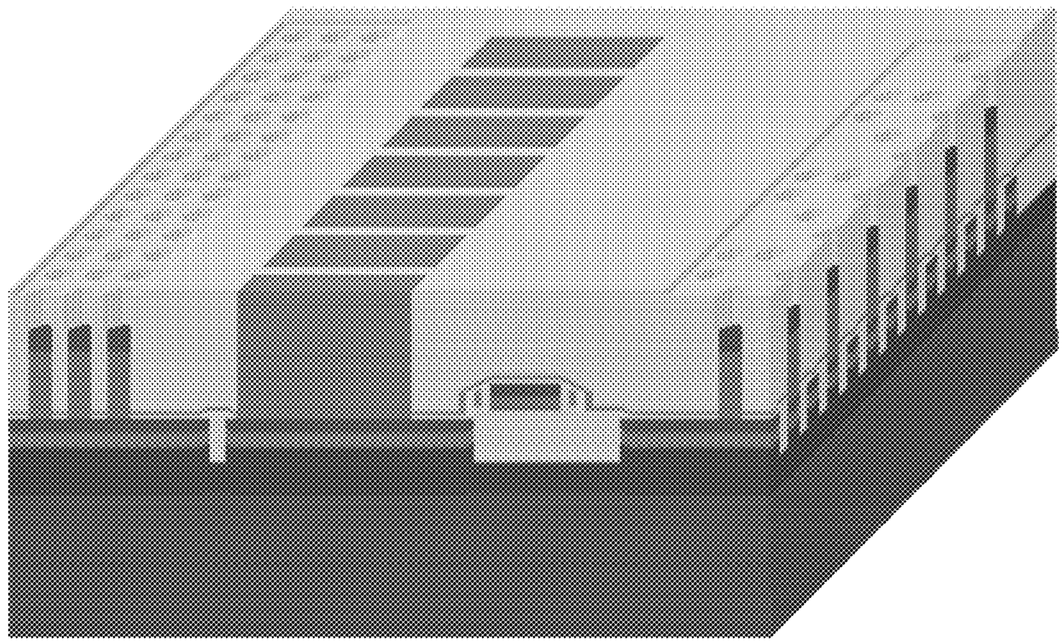
FIG. 16 illustrates a portion of a substrate at a point during manufacture following the etchback of the diodes to adjust their heights and to form cups (into which information storage elements can be formed on the memory array diodes); and illustrating the diodes having been implanted with their P-type implants to form P-I-N diodes.

FIG. 14 depicts the substrate on which photoresist has been exposed to show the area of the bodies of the bipolar transistors but not the area of the bodies of the diodes (for both the memory array storage elements and for the diode decoders) using a large size feature (i.e., non-critical geometry or reduced geometry features for lower cost) such that the bipolar transistor bodies can be implanted with N-type dopant. This is because the epi-silicon is grown as intrinsic silicon (to provide the intrinsic region for the P-I-N memory and decoder diodes). The body of the PNP bipolar transistors is implanted N-type at this stage to provide an N-type base region into which the P-type emitter and collector terminals will be formed. This photoresist is then stripped and another photo step is performed to expose the area of the bodies of the diodes (for both the memory array storage elements and for the diode decoders) but not the area of the bodies of the bipolar transistors (with another non-critical mask) as depicted in FIG. 15. The diodes are then etched back to adjust their heights and to form cups (into which information storage elements can be formed on the memory array diodes). Once these cups have been formed, a P-type implant is performed to create the anodes of the now P-I-N diodes (as depicted in FIG. 16). The diode height and this P-type implant characteristics are all selected according to the desired diode characteristics being desired as is well understood and known by those skilled in the art.

Figure 17:
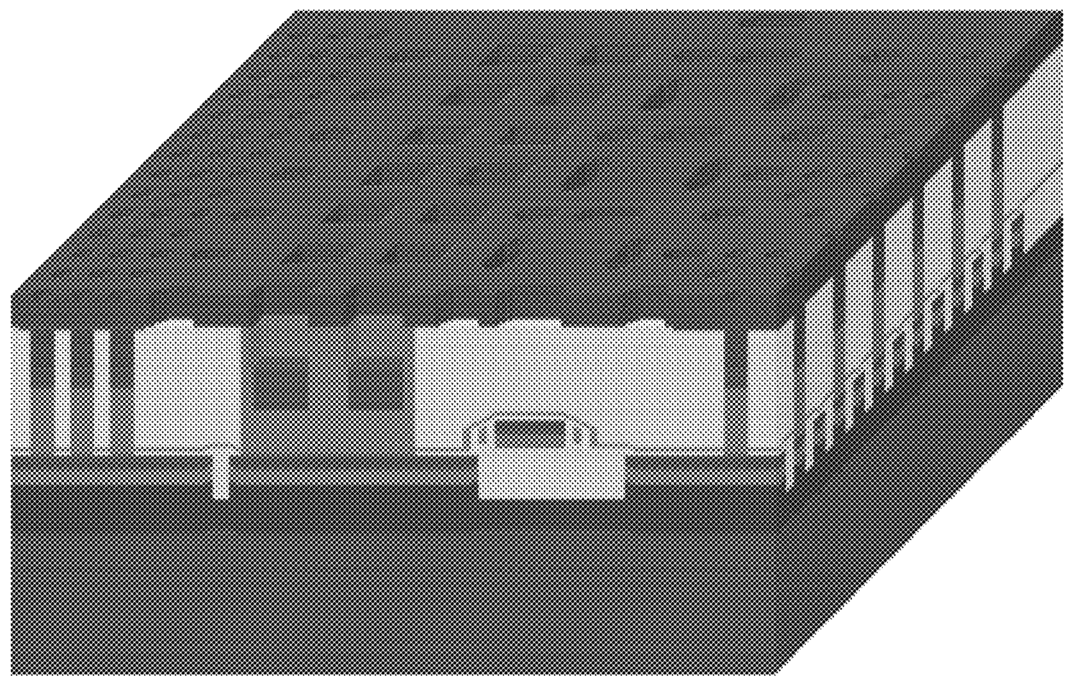
FIG. 17 illustrates a portion of a substrate at a point during manufacture on which photoresist has been exposed and developed to open the contacts to the bit-lines and the MOS transistors as well as the emitter and collector areas in the bodies of the bipolar transistors, following which the emitters and collectors of the bipolar transistors have been formed by a silicon etchback and a P-type implanting.
Figure 18:
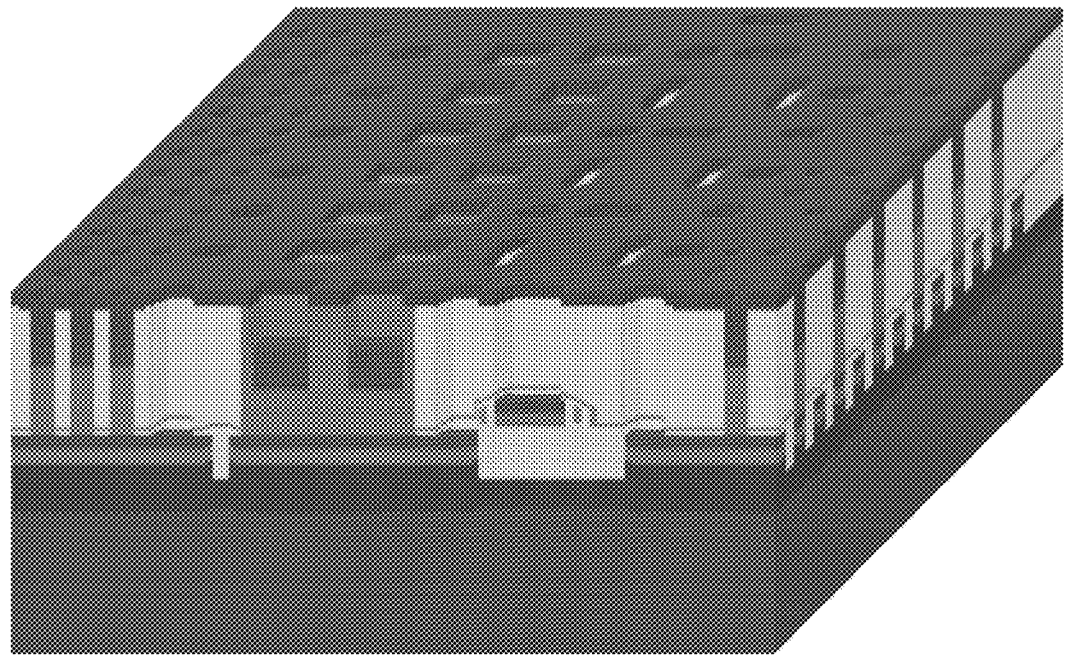
FIG. 18 illustrates a portion of a substrate at a point during manufacture following by an oxide etch to form the contact holes to the bit-lines and the MOS transistors.

Next in the process is the lithography for the contact openings. These contacts are generally to all the N-type features in the substrate's surface, including the source, drain and gate contacts to the NMOS, contacts to the bit lines, and contacts to the base terminal of the bipolar transistors; in addition, contacts to the emitters and collectors of the bipolar transistors are patterned as well. Upon spinning on the photoresist, exposing the contact openings, developing and other associated lithography steps as are well known to those skilled in the art, the surface will be protected by resist everywhere but where these contacts are to be formed. This is followed by a silicon etch. This etch is selective to etch silicon and only slightly etch the field dielectric (e.g., silicon dioxide). This timed etch will recess the areas in the body of the bipolar transistors where the emitter and collector will be formed. A P-type implant can now be performed to create the volume of the emitters and collectors at the bottoms of these etched openings in the bodies of the bipolar transistors as is well known to those skilled in the art, and as is depicted in FIG. 17. Following this, a dielectric etch is performed to create the contact openings to the original substrate surface (e.g., an oxide etch that is selective to remove oxide much faster than silicon until the etch stop nitride layer at which point a nitride etch is utilized to open the contact holes to the N-type doped silicon of the N-type features in the substrate's surface, including the source, drain and gate contacts to the NMOS, contacts to the bit lines, and contacts to the base terminal of the bipolar transistors). FIG. 18 depicts the wafer after the contact openings are etched.

Figure 19:
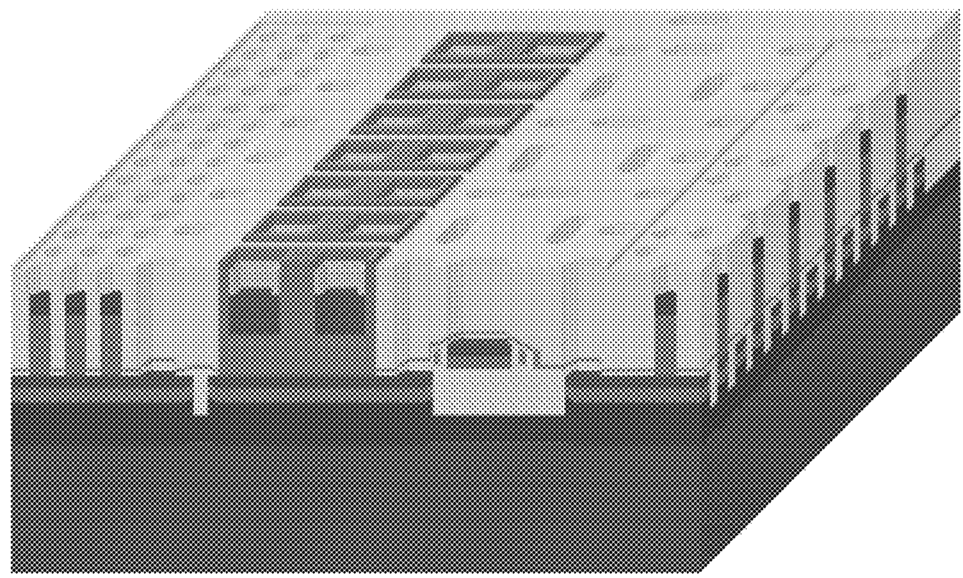
FIG. 19 illustrates a portion of a substrate at a point during manufacture following oxide spacer formation by thermal oxide growth and oxide etchback.

The resist is then stripped and a thin thermal oxide is grown. This thermal oxide growth will simultaneously anneal the various preceding implants. A thin layer of oxide will now line the openings of the emitter and the collector openings as well as line the top of the previously exposed silicon in the bottom of the other contact openings. A directional oxide spacer etchback etch (e.g., RIE) will clear the surfaces of this thin oxide layer while leaving the oxide on the sidewalls of the emitter and collector openings, akin to the spacer formation often done on the gate of a fine geometry MOS transistor. This is depicted in FIG. 19.

Figure 20:
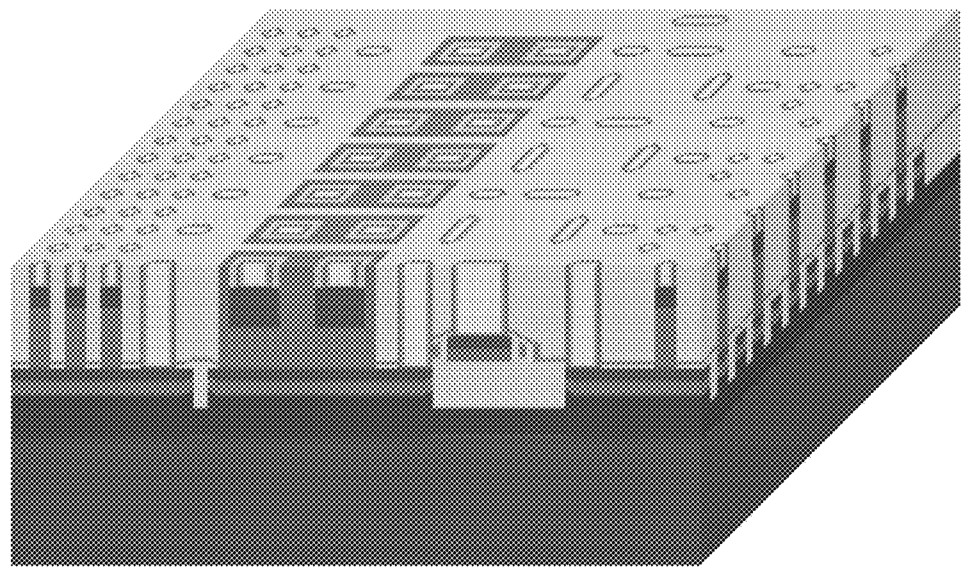
FIG. 20 illustrates a portion of a substrate at a point during manufacture following contact formation by deposition of an adhesion liner and tungsten followed by tungsten CMP.

The formation of metal contacts follows by deposition of an adhesion liner film and then tungsten followed by tungsten CMP. This tungsten CMP must be continued until the liner oxide around the emitters and the collectors is exposed to the surface; this is to ensure that the surface contacts to the emitters and collectors do not have any residual metal shorts to the surrounding body of the transistor base material. This is depicted in FIG. 20.

At this point in the process, the information storage elements can be formed on top of the memory array diodes. This is accomplished by selectively exposing the areas comprising the memory array diodes with lithography to protect all of the other tungsten contacts and then etching back the tungsten contact plugs on top of the memory array diodes only to form cups thereon. This lithography will typically comprise larger feature geometries as whole memory arrays are opened up at a time. These cups upon the memory array diodes can be processed in a variety of ways with a variety of materials to form a variety of memory storage elements. The storage element can comprise a fuse, an antifuse, a phase-change material such as a Chalcogenide (including a Chalcogenide in which the programmed resistivity can be one of two resistance values and, in the case of more than one bit per cell storage cells, in which the programmed resistivity can be one of three or more resistance values), or a resistance that can be electrically altered or some other two terminal information storage element known in the prior art or yet to be invented.

Figure 21:
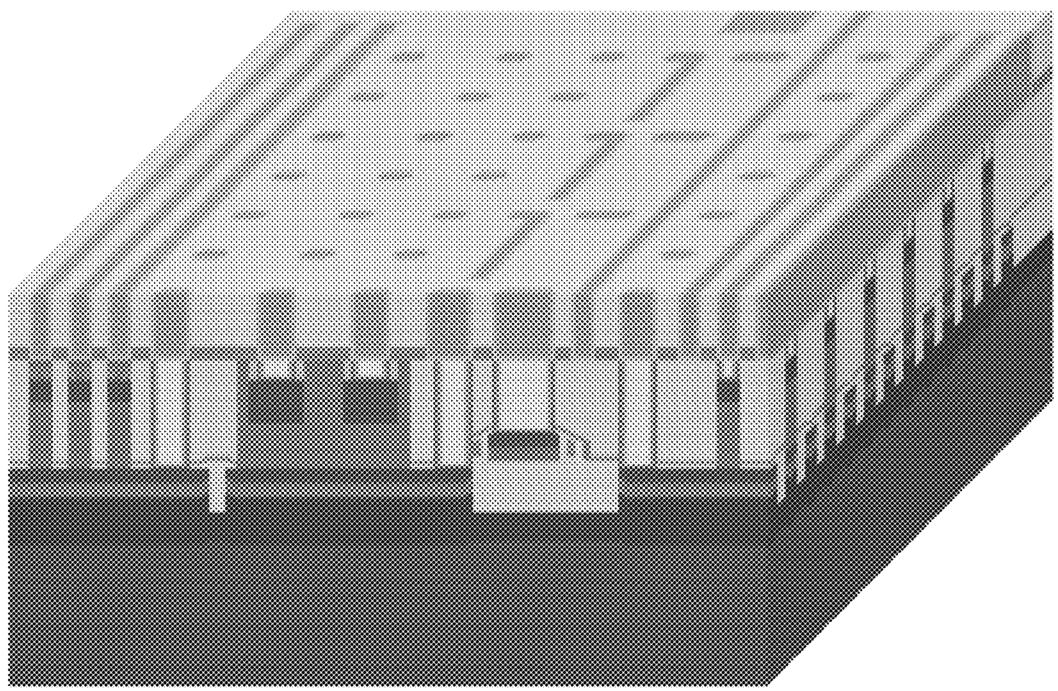
FIG. 21 illustrates a portion of a substrate at a point during manufacture following first metal layer formation (showing metal traces and vias to second metal layer) by copper damascene processing.
Figure 22:
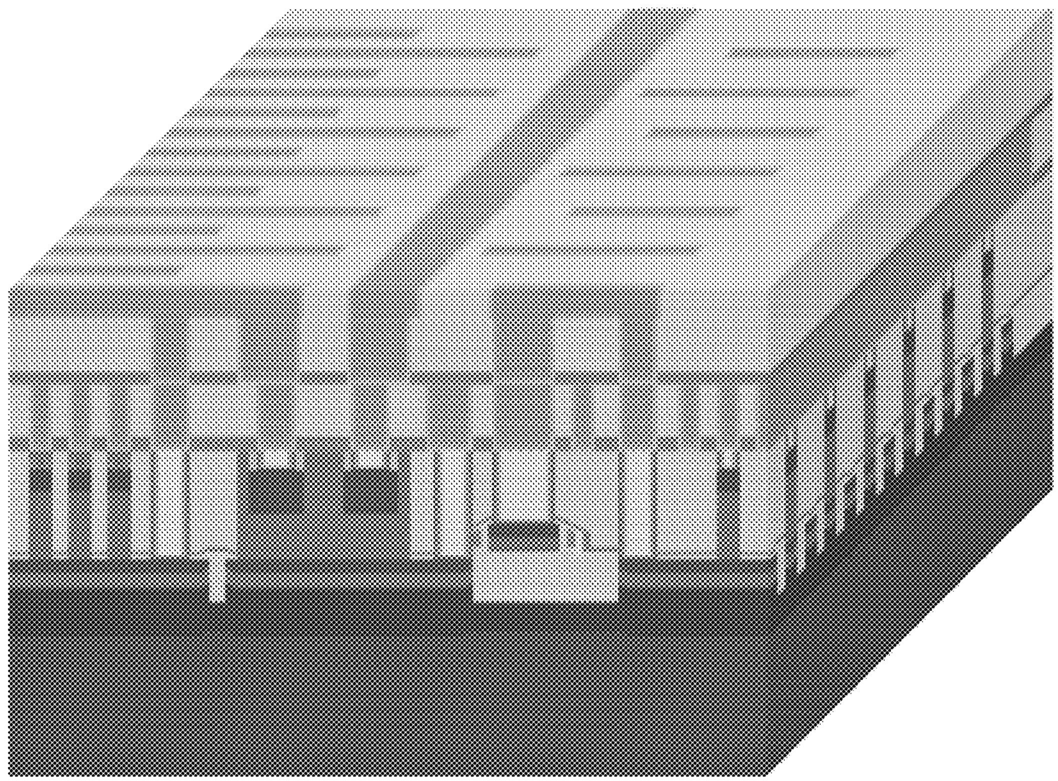
FIG. 22 illustrates a portion of a substrate at a point during manufacture following a subsequent metal layer formation by copper dual-damascene processing.

This information storage elements formation is followed standard back-end processing for metal interconnects. The formation of a first metal layer (showing metal traces and vias to second metal layer) by copper damascene processing is depicted in FIG. 21 and a second layer of metal by copper dual-damascene processing is depicted in FIG. 22.

With the above approach, the bipolar transistor (or bipolar transistor-like structure) is formed having long (i.e., left to right as shown in the figures) and narrow openings for the emitters and collectors; that is to say the emitters and collectors are as small as one geometric feature (F) in width, but many features in length (as opposed to the diodes which are one feature square or the memory cells which are $4F^2$). Because the openings for these emitters and collectors are larger than $1F^2$, they can be patterned in thicker photoresist. This makes it possible to etch the holes for the contacts without the use of a hard mask as was done to etch the openings for the diodes (i.e., the diode-like structures) and bodies of the bipolar transistors (i.e., the bipolar transistor-like structures). However, as those skilled in the art know, different manufacturing and fabrication facilities (fabs) will have different tool sets, and different contamination procedures, and the like; as a result, they will be capable of different structures. For example, a multi-chamber etch tool running the same process recipe, will etch a given material at a slightly different rate in each chamber. This can be for a variety of reasons including what materials and processes were present in the chamber previously, slight variations in the construction of the chambers, slight differences in gas pressure due to the plumbing to reach each chamber, and so on. Those skilled in the art of semiconductor process engineering and process transferring are well aware of these subtle differences and are skilled in the art of fine tuning the process to fit various fabs and available tools and conditions to make a given process yield. As such, the present teaching may require slight modifications depending upon the fab in which the present teaching is being practiced that do not take away from the general concept of the present invention being taught herein.

For example, an alternative approach to etching the contact holes is to deposit a poly hard mask just after the epi-silicon CMP step, either just before or just after the stage depicted in FIG. 14 (if the poly hard mask is deposited prior to the bipolar transistor base implant, the bipolar transistor base implant will have to be driven deeper to compensate for this extra layer of silicon). The contact opening features through this hard mask will be cleared when the silicon etch to form the emitter and collector cups is done. However, the hard mask will be removed when the cups over the diodes are formed. The stepped down area around the diodes, as shown in FIG. 16, will need to be made deep enough to trap additional resist to protect these areas during contact etching. Alternatively, BARC could be used to fill the diode cups and these areas around the diodes, in which case the silicon etch to form the emitter and collector cups will need to etch through this BARC layer as well. Also, the tungsten CMP will have to be continued long enough to remove any remaining hard mask material.

The teaching of the present invention will enable one skilled in the art to practice the fabrication of these bipolar transistor-like structures in parallel with the diode-like structures. The fine tuning of the doping concentrations through the control of the implant dosages, energies and species, as well as the final selected geometries, will determine the device characteristics. For example, the height of the resulting intrinsic region in the P-I-N diode as well as the N+ concentration of the bit-line (which is the N-type portion of the cathode) and the P+ concentration of the diode top (anode) will help to control the reverse leakage and forward current of the diode, among other things. Likewise, the doping profiles of the bipolar transistor and the length of the spacing between the emitter and collector (left to right in the Figures) will help to control the transistor characteristics. Additional lithography will enable differently doped emitter and collector terminals, as will be clear to those skilled in the art.

The present invention can be used in a variety of circuits. In particular, embodiments of the present invention can be used in the design of devices such as memory products, and in particular non-volatile memory products, for portable devices wherein low power is desirable as well as other devices wherein low power may not be as necessary. The present invention can be implemented with cross point memory arrays wherein the memory arrays' surrounding circuitry is also implemented with embodiments of the present invention; these arrays may be one of many tiles or sub-arrays in a larger device or an array within a 3-D arrangement of arrays or tiles. In such a memory device, the storage cells can incorporate diodes or other non-linear conductor devices that conduct current better in one direction than the other for a given applied voltage. The so-called diodes in each memory cell can actually be one of the two P-N junctions of a bipolar transistor or part of a thyristor, a four layer diode, or the like. Memory devices incorporating embodiments of the present invention may be applied to memory devices and systems for storing digital text, digital books, digital music (such as MP3 players and cellular telephones), digital audio, digital photographs (wherein one or more digital still images can be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the present invention may be embedded or removable, and may be interchangeable among other devices that can access the data therein. Embodiments of the invention may be packaged in any variety of industry-standard form factor, including Compact Flash, Secure Digital, MultiMedia Cards, PCMCIA Cards, Memory Stick, USB devices, any of a large variety of integrated circuit packages including Ball Grid Arrays, Dual In-Line Packages (DIP's), SOIC's, PLCC, TQFP's and the like, as well as in proprietary form factors and custom designed packages. These packages can contain just the memory chip, multiple memory chips, one or more memory chips along with other logic devices or other storage devices such as PLD's, PLA's, micro-controllers, microprocessors, controller chips or chip-sets or other custom or standard circuitry.

One of the overriding concepts of the present invention is that, because the memory array and address decoders are made of diodes and because bipolar transistors are two back-to-back diodes, both the diodes and the bipolar transistors can be formed (that is to say, the lithography to pattern the bodies of both the diodes and the bipolar transistors) can be formed together. This reduces the number of processing steps and lowers the cost to manufacture. Many variations come to mind in light of the present teaching. These include using any combination of processing techniques that can be used to manufacture the diodes and bipolar transistors in parallel, or mostly or generally in parallel, in a semiconductor fabrication facility (fab). For example, the diodes and bipolar transistors could be patterned in an open area of silicon whereby the patterning and etching results in an area comprising silicon pillars and silicon blocks (to become the diodes and bipolar transistors, respectively) around which a dielectric material is filled and planarized to expose the tops of these silicon features (as opposed to etching openings in an area of dielectric and filling these openings with silicon to form the diodes and bipolar transistors as described above).

The foregoing description of and examples of the preferred embodiment of the invention and the variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description.

I claim:

1. An electronic memory device comprising:

control logic for controlling one or more information storage arrays, the control logic comprising:

(A) one or more NMOS transistors, one or more PNP bipolar transistors, and no PMOS transistors, wherein each PNP bipolar transistor has (i) a base electrically coupled to an NMOS transistor, (ii) an emitter, and (iii) a collector through which a line of an information storage array is energized in response to switching of the NMOS transistor; or (B) one or more PMOS transistors, one or more NPN bipolar transistors, and no NMOS transistors, wherein each NPN bipolar transistor has (i) a base electrically coupled to a PMOS transistor, (ii) an emitter, and (iii) a collector through which a line of an information storage array is energized in response to switching of the PMOS transistor.

2. The electronic memory device of claim 1, wherein (i) the control logic comprises one or more NMOS transistors, one or more PNP bipolar transistors, and no PMOS transistors, and (ii) each NMOS transistor is configured to pull the base of a PNP bipolar transistor to a low voltage state.

3. The electronic memory device of claim 1, wherein (i) the control logic comprises one or more PMOS transistors, one or more NPN bipolar transistors, and no NMOS transistors, and (ii) each PMOS transistor is configured to pull the base of a NPN bipolar transistor to a high voltage state.

4. The electronic memory device of claim 1, further comprising one or more information storage arrays each having (i) a plurality of word lines, (ii) a plurality of bit lines intersecting the plurality of word lines, and (iii) a plurality of storage locations each disposed proximate a point of intersection between a word line and a bit line, wherein each word line is electronically coupled to a PNP bipolar transistor or an NPN bipolar transistor.

5. The electronic memory device of claim 4, further comprising a non-linear conductor disposed at least at one storage location.

6. The electronic memory device of claim 5, wherein the non-linear conductor comprises a diode, a base-emitter junction of a bipolar transistor, a base-collector junction of a bipolar transistor, or a vertical MOS transistor.

7. The electronic memory device of claim 1, wherein the control logic comprises a plurality of NMOS transistors and a plurality of PNP bipolar transistors, further comprising an address decoder coupled to the plurality of NMOS transistors.

* * * * *